United States Patent
Felts, III et al.

(10) Patent No.: US 6,581,164 B1
(45) Date of Patent: Jun. 17, 2003

(54) SYSTEM FOR ADJUSTING CLOCK FREQUENCY BASED UPON AMOUNT OF UNREAD DATA STORED IN SEQUENTIAL MEMORY WHEN READING A NEW LINE OF DATA WITHIN A FIELD OF DATA

(75) Inventors: Benjamin Edwin Felts, III, Cardiff, CA (US); Asif Shakeel, San Diego, CA (US); Havard Lee Scott, San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/476,849

(22) Filed: Jan. 3, 2000

(51) Int. Cl.$^7$ ................................................ G06F 1/12
(52) U.S. Cl. ...................... 713/400; 710/52; 710/57; 710/61; 710/310; 713/503; 713/600
(58) Field of Search ................................ 713/400, 600; 710/310, 61, 53, 52

(56) References Cited

U.S. PATENT DOCUMENTS

| | | | | |
|---|---|---|---|---|
| 3,747,107 A | * | 7/1973 | Poppe et al. | 342/417 |
| 4,661,966 A | * | 4/1987 | Schreiner | 370/477 |
| 4,667,324 A | * | 5/1987 | Graves | 370/505 |
| 4,675,749 A | * | 6/1987 | Banno et al. | 369/59.19 |
| 4,896,337 A | * | 1/1990 | Bushy, Jr. | 327/261 |
| 4,941,156 A | * | 7/1990 | Stern et al. | 331/158 |
| 5,689,689 A | * | 11/1997 | Meyers et al. | 709/400 |
| 5,692,137 A | * | 11/1997 | Regal et al. | 710/310 |
| 5,956,347 A | * | 9/1999 | Slater | 370/503 |
| 6,009,499 A | * | 12/1999 | Koppala | 711/132 |
| 6,172,964 B1 | * | 1/2001 | Whitton | 370/230 |

* cited by examiner

Primary Examiner—Thomas Lee
Assistant Examiner—Mark Connolly
(74) Attorney, Agent, or Firm—Procopio, Cory, Hargreaves & Savitch, LLP (57) ABSTRACT

A method for adjusting timing of a secondary system with respect to a reference system is disclosed. The secondary and reference systems include a secondary synchronization signal and a reference synchronization signal, which are used to detect a phase difference between the secondary synchronization signal and the reference synchronization signal. A filtered phase error is generated from the detected phase difference. In addition, a frequency difference is detected between the secondary synchronization signal and the reference synchronization signal, and an instantaneous frequency difference and a filtered frequency error are generated from the detected frequency difference. The filtered phase error and the filtered frequency error are accumulated, and the timing of the secondary system is controlled in accordance with the accumulated filtered phase error, the accumulated filtered frequency error, and the instantaneous frequency difference.

17 Claims, 5 Drawing Sheets

SYSTEM FOR ADJUSTING CLOCK FREQUENCY BASED UPON AMOUNT OF UNREAD DATA STORED IN SEQUENTIAL MEMORY WHEN READING A NEW LINE OF DATA WITHIN A FIELD OF DATA

BACKGROUND OF THE INVENTION

1. Field of the Invention

The present invention relates, generally, to systems and processes for tracking the timing of asynchronous systems in a manner that accommodates timing irregularities in a reference system while maintaining a stable output in a tracking system, and in particular embodiments, to methods for tracking the read timing of a video encoder to the write timing of a video decoder, and systems incorporating the same.

2. Description of Related Art

It is often desirable to transfer data between two or more systems that are not synchronized to a common timing source. For example, in video signal processing systems, video data from a video source such as a video cassette recorder (VCR:) may be transferred to a video display device for viewing. Because the VCR and the video display device do not have a common timing source, the timing between these two asynchronous systems must be carefully controlled, or tracked, to minimize data transfer errors. For purposes of illustration, the timing of a video signal processing system will be discussed in detail below, but it should be understood that the basic timing issues inherent in a video signal processing system are equally applicable to other asynchronous systems.

Modern video signal processing systems often combine audio, video, and graphics for viewing on a video display device. In such multi-media systems, graphics information must be integrated into the audio and video information present within an analog video signal. Integrating graphics information into a video signal is often more easily accomplished in the digital domain. Thus, it is desirable to decode the analog video signal into digital form, integrate the graphics information, and encode the combined signal back into an analog form compatible with typical video display devices.

There are several different standardized formats for the analog video signal. One such format is NTSC (National Television System Committee), which is used in the United States and Japan. Another is PAL (Phase Alternation Lines), which is used in Great Britain and Europe. A third is SECAM, which is used in France, Russia and other parts of Europe. For purposes of simplifying the following description, only NTSC timing will be discussed. However, the other formats are similar and have only slight variations, and therefore the following discussion is conceptually applicable to all formats.

Figure 1:
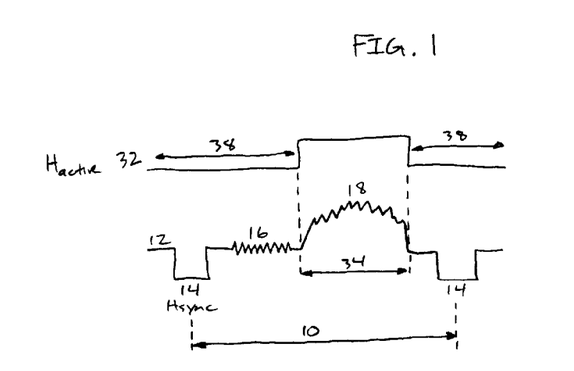
FIG. 1 is a timing diagram, not to scale, of one line of analog video information and a corresponding control signal $H_{active}$.

As shown in FIG. 1, within an analog video signal is a single "line" 10 of analog video information. A line 10 is typically comprised of a front porch 12, a horizontal synchronization pulse ($H_{sync}$) 14, a subcarrier burst 16, and serial pixel data 18.

Subcarrier burst 16 is a sample of the reference subcarrier used to modulate U and V color signals and generate chrominance signals within serial pixel data 18. The U color signal is modulated with one phase of the reference subcarrier, while the V color signal is modulated with a 90° phase-shifted version of the reference subcarrier. The U and V color signals are added together to form the chrominance portion of the video signal. When decoding the analog video signal, the reference subcarrier is re-created by phase-locking a frequency source (at the subcarrier burst rate) to subcarrier burst 16. The re-created reference subcarrier is then used to demodulate the chrominance signals within serial pixel data 18 and recover the U and V color signals. In the NTSC standard, the reference subcarrier is defined to have a frequency of 3.579545 MHz±10 Hz, with 227.5 reference subcarrier cycles per line. The line frequency in NTSC is therefore equal to approximately 3.579545 MHz÷227.5 cycles per line, or approximately 15.734 kHz.

Pixel data 18 contains information representing one horizontal line of pixels on a video display device. Serial pixel data 18 is followed by a second $H_{sync}$ 14, signifying the end of the present line and the start of a new line. Thus, $H_{syncs}$ 14 mark the boundary between successive lines 10 of analog video information. The voltage swing of the typical analog video signal is approximately 1.3 volts maximum.

Figure 2:
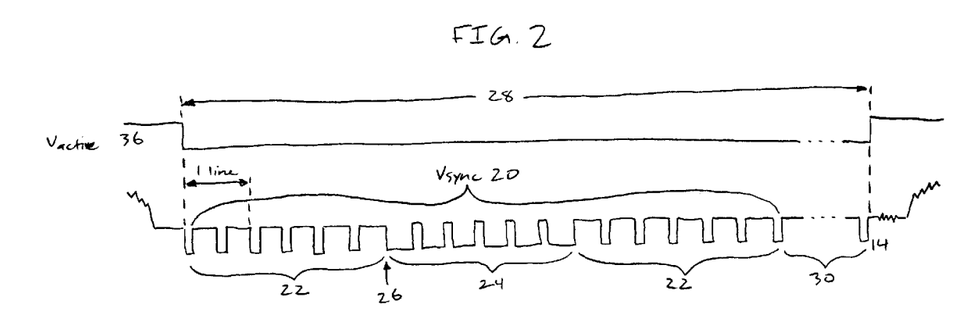
FIG. 2 is a timing diagram, not to scale, of a vertical blanking region and an associated control signal $V_{active}$.

One "field" of video information is defined as a sequence of lines representing one refresh of a video display device from top to bottom. A vertical synchronization pulse ($V_{sync}$) marks the boundary between successive fields of video information. For NTSC, there are 262.5 lines from one $V_{sync}$ to the next. Thus, the field frequency is approximately 15.734 kHz÷262.5, or approximately 59.94 Hz. As illustrated in FIG. 2, $V_{sync}$ 20 is not a single pulse, but rather is a signal superimposed on the analog video signal comprised of a series of equalization pulses 22, each pulse being approximately one-half of a line long, followed by a series of wider serration pulses 24, followed by another series of equalization pulses 22. The actual vertical synchronization event 26 occurs at the boundary between the first set of equalization pulses 22 and the sequence of serration pulses 24. $V_{sync}$ 20 represents the start of a vertical blanking region ($V_{blanking}$) 28, the time during which the electron beam in tube-type video display devices resets from the bottom to the top of the display device. $V_{blanking}$ 28 includes $V_{sync}$ 20 and 11 more lines of $H_{sync}$, that follow $V_{sync}$ (see reference character 30; FIG. 2 not drawn to scale). At the end of $V_{blanking}$ 28, an $H_{sync}$ 14 marks the beginning of the first active line in the new field.

Other timing signals derived from the analog video signal are generated within a typical video signal processing system, including a horizontal active signal ($H_{active}$) and a vertical active signal ($V_{active}$). Referring to FIG. 1, when $H_{active}$ 32 is asserted (high in the example of FIG. 1), serial pixel data 18 is being communicated in an active region 34 of a line 10 of analog video information. Associated with $H_{active}$ 32 is horizontal blanking region ($H_{blanking}$) 38, which occurs when serial pixel data 18 is not being communicated in the active region of a line 10 (i.e., when $H_{active}$ 32 is not asserted). Referring to FIG. 2, when $V_{active}$ 36 is asserted (high in the example of FIG. 2) a field of video information is being refreshed, and the video signal is not in $V_{blanking}$ region 28.

Figure 3:
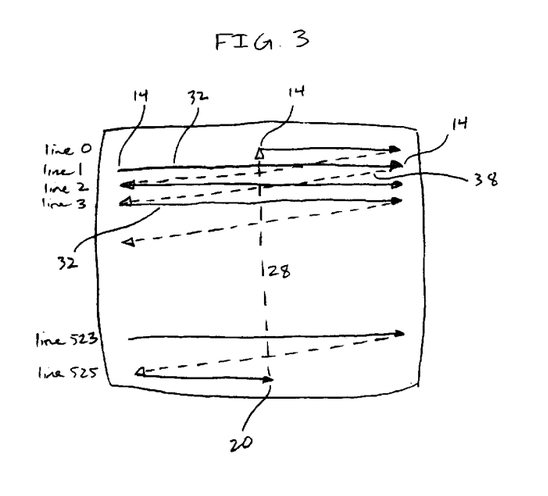
FIG. 3 is an illustration, not to scale, of a video display device and the interlaced refreshing of lines.

Video information is often interlaced, which means that during the refreshing of a field, only every other line on a video display device is refreshed. Two fields of video data are therefore needed to completely refresh the screen of a video display device. For example, FIG. 3 illustrates one method of interlacing using the NTSC format and a conventional picture tube embodiment of a video display device which focuses a beam to excite phosphors R, G and B and produce a color for each pixel. In FIG. 3, after a first $V_{blanking}$ followed by an $H_{sync}$ 14 is received, $H_{active}$ 32 is asserted and line 1 is refreshed. Line 1 concludes with $H_{sync}$ 14 followed by $H_{blanking}$ 38, during which time the beam moves to the beginning of line 3. $H_{active}$ 32 is again asserted, and line 3 is then refreshed. This process continues for lines 5, 7, 9, etc. (the "odd" field). After 262.5 lines of the odd field are refreshed, a $V_{sync}$ 20 will be received with the first serration pulse occurring in the middle of a line rather than at the beginning of the line (the last half line of the odd field), signifying the end of the odd field. A $V_{blanking}$ period 28 is then entered, during which time the beam returns to the top of the video display device. When an $H_{sync}$ 14 signifying the start of the next active line is received, lines 0, 2, 4, 6, etc. (the "even" field) are refreshed. When all 262.5 lines of the even field have been written, the bottom of the video display device is again reached, and a $V_{sync}$ is received in alignment with an $H_{sync}$, which causes the beam to move back to the top of the display device and reset to line 1. The complete refreshing of a full screen of a video display device, including an odd field and an even field, is defined as one "frame."

Because overlaying graphics information onto a video signal is often more easily accomplished in the digital domain, in conventional multi-media systems the analog video signal is first communicated to a video decoder which converts the analog video signal to digital information. The digital outputs of the video decoder are then communicated to a video encoder, where the pixel data is integrated with the graphics information and converted back into analog form to be compatible with typical video display devices. However, because the video encoder is asynchronous with respect to the video decoder, timing problems may occur during the simultaneous operation of the video decoder and the video encoder. Several techniques are known in the art for addressing this problem.

Figure 4:
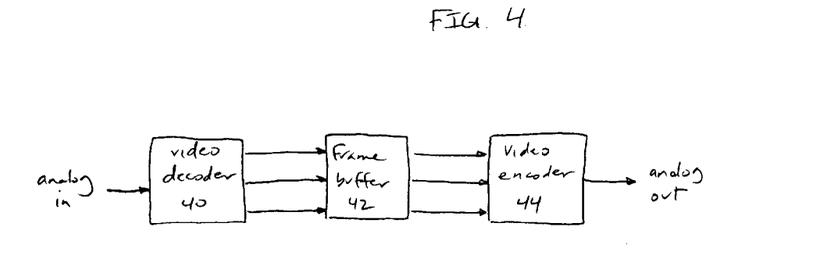
FIG. 4 is a block diagram of an asynchronous system for communicating video information between video decoder and a video encoder.

In the simplest approach illustrated in FIG. 4, a video decoder 40 uses a video decoder sampling clock to sample the analog video signal, and writes the sampled data into a frame buffer 42 (memory capable of storing an entire frame of video) using a write clock at a location identified by a write pointer. A video encoder 44 then uses a read clock which is asynchronous to the write clock to read this data out of the frame buffer at a location identified by a read pointer. There are disadvantages to this approach because the write and read clocks of video decoder 40 and video encoder 44 are asynchronous, and therefore their timebases will eventually drift apart. Eventually, when the accumulated drift of the timing difference between video decoder 40 and video encoder 44 reaches one frame, the read and write pointers in frame buffer 42 will cross. When this occurs, a frame's worth of data will either be dropped or repeated. If this occurs within a field, rather than between fields, then a visible artifact is produced which is call a "tear."

An additional field can be added to the frame buffer to eliminate the occurrence of tearing in the middle of a field (wherein the first portion of the field would contain data from one frame and the latter portion of the field would contain data from another frame). If a three-field buffer is used, the read and write pointers can be monitored to determine the field in which a crossing of read and write pointers will occur. Before the crossing occurs, however, the pointer that is about to "overtake" the other pointer is moved "back" in the three-field buffer by two fields (the three-field buffer being constructed in a recirculating manner). For example, if the buffer contains fields 1, 2, and 3, and it is determined that the read pointer will overtake the write pointer in field 3, then the read pointer is reset to field 1. This resetting of the read pointer will result in the repeating of one frame's worth of data, but the timing of the reset can be selected such that it occurs in the $V_{blanking}$ region of a field, when it will not produce a tear visible on the display device. For example, in consecutive fields A, B, C and D, without the three-field buffer a tear may occur in the active region of a field, resulting in a six-field sequence of field A, field B, a torn field C, a repeated field B, then field C and field D. With the three-field buffer, the reset can be manipulated to occur "off-screen," resulting in a six-field sequence of field A, field B, an off-screen reset, a repeated field A and field B, then field C and field D. Visually, tearing is generally a more objectionable artifact than repeating or dropping a frame. This frame buffer solution is simple but expensive, for a frame's worth of memory is costly.

Figure 5:
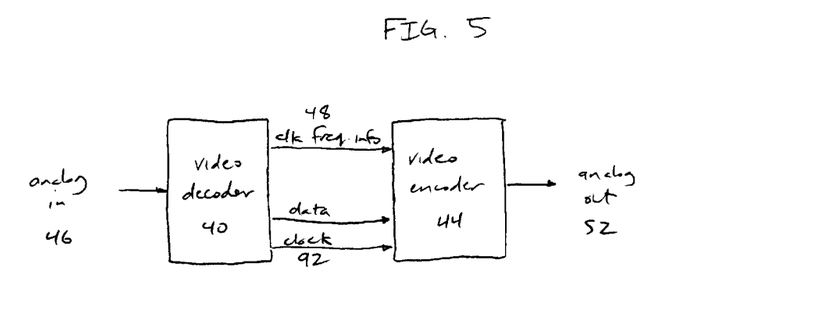
FIG. 5 is a block diagram of a line-locked system for communicating video information between a video decoder and a video encoder.

A second approach is illustrated in FIG. 5. In this approach video decoder 40 includes a video decoder sampling clock 92 that is tightly line-locked to incoming analog video signal 46. A phase-locked-loop (PLL) and a loop filter within video decoder 40 detects where $H_{syncs}$ or subcarrier burst edges occur relative to edges of video decoder sampling clock 92 and continuously adjusts the frequency of video decoder sampling clock 92 to align the clock with the $H_{syncs}$ or subcarrier burst edges of incoming analog video signal 46.

However, these frequency adjustments to video decoder sample clock 92 may be significant when certain analog video signal sources are employed. In particular, VCRs are unstable video sources that do not generate consistent $H_{syncs}$. The time between consecutive $H_{syncs}$ may vary by ±2 to 4 pixels per line, and thus the PLL may have to make a large adjustment to the video decoder sampling clock frequency to align the clock with the incoming analog video signal 46. Additionally, in VCRs a head switch line is encountered at the bottom of each field, which is substantially different in length from the other lines in the field. Although most lines will average slightly different than the ideal time of a line (e.g. 20 nanoseconds less), the error in the head switch line will be approximately equal to the accumulation of the error in all the previous lines in that field and opposite in sign. When a head switch line is encountered in the sequence of $H_{syncs}$ being tracked, a very large adjustment to the video decoder sampling clock frequency is necessary to achieve proper realignment by the time the $V_{blanking}$ region is completed and the first few active lines in the new field are displayed.

Figure 6:
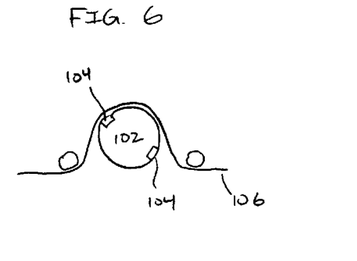
FIG. 6 is a top view, not to scale, of a VCR tape engaged against a video head drum.
Figure 7:
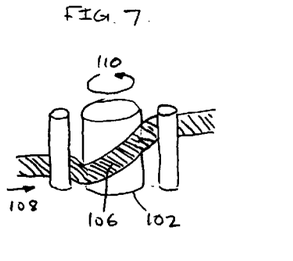
FIG. 7 is a perspective view, not to scale, of a VCR tape engaged against a video head drum.
Figure 8:
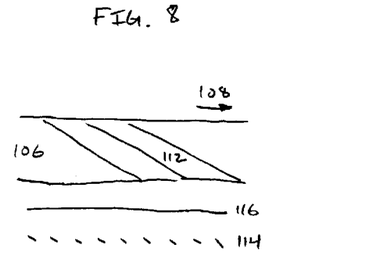
FIG. 8 is a perspective view, not to scale, of tracks on a VCR tape.

The head switch line in VCR video sources is a product of the mechanics of a VCR. As illustrated in FIG. 6, a VCR includes a video head drum 102 with two playback heads 104 located on opposite sides of video head drum 102. As illustrated in FIG. 7, tape 106 is helically wrapped around video head drum 102. Tape 106 travels in the direction indicated by reference character 108, while video head drum 102 rotates in the same direction as indicated by reference character 110. Tape 106 makes contact with about 180° of video head drum 102 at any time, and thus one playback head 104 is always in contact with tape 106. As video head drum 102 rotates 180°, one playback head will scan one field as it contacts tape 106, tracing a diagonal video track 112 across tape 106 as illustrated in FIG. 8. As video head drum 102 continues to rotate, the playback head will lose contact with tape 106, but the next playback head will be in position to contact tape 106 and scan the next field. In combination with the movement of tape 106 in direction 108, another diagonal video track 112 will be traced on tape 106 adjacent to the previous track. When the VCR switches from one head to another, the head switch line is created. In addition to the diagonal video tracks 112, diagonal $V_{sync}$ tracks 114 and a longitudinal control track 116 on tape 106 are read by separate heads. The VCR uses this information to control the revolution rate of video head drum 102 and the tape speed to keep the field rate relatively stable and accurate.

Large adjustments to the frequency of video decoder sampling clock 92 due to a head switch line or other timing anomaly create difficulties in the video encoder's re-creation of the reference subcarrier. Video encoder 44 receives video decoder sampling clock 92 and uses a known relationship between video decoder sampling clock 92 and the reference subcarrier to re-create the reference subcarrier. Typically, for NTSC analog video signals, the reference subcarrier must be 3.579545 MHz±10 Hz (less than three parts per million (ppm)). However, to track the head switch line, the video decoder sampling clock frequency must be pulled many thousands of ppm away from nominal, changing the phase relationship between video decoder sampling clock 92 and the reference subcarrier. If this change in the phase relationship is not taken into account, the reference subcarrier re-created by video encoder 44 will be off frequency, and errors in chrominance processing may result. Thus, referring again to FIG. 5, information 48 indicating the extent of the frequency variation for a given line must be passed from video decoder 40 to video encoder 44 to properly re-create the reference subcarrier in video encoder 44.

In addition, when analog video signal 46 is from a source such as a VCR, the reference subcarrier is not mathematically linked to the $H_{syncs}$, (i.e. the relative phase does not change by the same amount from line to line), and thus the phase relationship of the reference subcarrier and $H_{sync}$ will not be consistent from line to line. The analog video signal communicated by video encoder 44 to the display device, including $H_{sync}$ and a re-created reference subcarrier, will therefore have the same timing irregularities and reference subcarrier phase drift relative to the $H_{sync}$ that exist in the source signal. Without a mathematically linked subcarrier, comb filtering and Y/C separation by the display device cannot be optimal.

It should be noted that the preceding discussion of the difficulties in tracking encoder read timing to decoder write timing illustrates a specific example of the more general problem of tracking the timing of asynchronous systems in a manner that accommodates timing irregularities in the reference system while maintaining a stable output in the tracking system.

SUMMARY OF THE DISCLOSURE

Therefore, it is an advantage of embodiments of the present invention to provide a system and process for tracking the timing of asynchronous systems in a manner that accommodates timing irregularities in the reference system while maintaining a stable output in the tracking system.

It is a further advantage of embodiments of the present invention to provide a video signal processing system and process for tracking the read timing of a video encoder to a video decoder's data stream to minimize the buffer size and to avoid dropping and/or repeating frames.

It is a further advantage of embodiments of the present invention to provide a video signal processing system and process with a reference subcarrier "mathematically linked" to $H_{syncs}$ to optimize the performance of comb-filtered Y/C separation in a video display device.

It is a further advantage of embodiments of the present invention to provide a video signal processing system and process for receiving and tracking an analog video signal that makes only very small changes in the clock frequency of the video encoder and therefore minimizes subcarrier jitter or frequency variations that would generate objectionable hue errors in the video display device.

It is a further advantage of embodiments of the present invention to provide a video signal processing system and process for receiving and tracking an analog video signal that can synchronize to a newly changed source (e.g. a channel change) quickly enough that the total source change to video display device synchronization time is not onerous to the user.

These and other advantages are accomplished according to a method for adjusting timing of a secondary system with respect to a reference system. The secondary and reference systems include a secondary synchronization signal and a reference synchronization signal, which are used to detect a phase difference between the secondary synchronization signal and the reference synchronization signal. A filtered phase error is generated from the detected phase difference. In addition, a frequency difference is detected between the secondary synchronization signal and the reference synchronization signal, and an instantaneous frequency difference and a filtered frequency error are generated from the detected frequency difference. The filtered phase error and the filtered frequency error are accumulated, and the timing of the secondary system is controlled in accordance with the accumulated filtered phase error, the accumulated filtered frequency error, and the instantaneous frequency difference.

In preferred embodiments, the above-identified advantages and other advantages are accomplished according to methods for adjusting the read timing associated with reading data from sequential memory with a read clock, with respect to the write timing associated with writing data into the sequential memory with a write clock.

The post-synchronization tracking method decreases the read clock frequency if the amount of unread data stored in the sequential memory at the start of reading a new line of data has decreased below a predefined threshold over one field of data, and increases the read clock frequency if the amount of unread data stored in the sequential memory at the start of reading a new line of data has increased above a predefined threshold over one field of data.

The semi-accelerated frequency tracking method decreases the read clock frequency if an accumulated frequency drift is greater than a positive drift threshold, and increases the read clock frequency if the accumulated frequency drift is less than a negative drift threshold.

The accelerated frequency tracking method decreases the read clock frequency according to a schedule of negative frequency adjustments computed from the accumulated frequency drift and a gain factor if an underflow condition occurs in the sequential memory, and increases the read clock frequency according to a schedule of positive frequency adjustments computed from the accumulated frequency drift and the gain factor if an overflow condition occurs in the sequential memory.

The horizontal alignment method delays the reading of data from the sequential memory by a first amount of time if an underflow condition occurs in the sequential memory, and moves forward the reading of data from the sequential memory by a second amount of time if an overflow condition occurs in the sequential memory.

The vertical alignment method maintains a read line count for keeping track of how many lines of data have been read within a particular field, and determines a field misalignment value representing the timing difference between the start of writing a first line of data in a first write field and the start of reading a first line of data in a first read field. The method moves forward the reading of data from the sequential memory by an amount of time equivalent to the field misalignment value when the read line count in a second read field immediately following the first read field reaches a read line count adjustment point, if the sum of the field misalignment value and the read line count adjustment point is less than one field.

These and other objects, features, and advantages of embodiments of the invention will be apparent to those skilled in the art from the following detailed description of embodiments of the invention, when read with the drawings and appended claims.

DETAILED DESCRIPTION OF PREFERRED EMBODIMENTS

In the following description of preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the preferred embodiments of the present invention.

A need often arises between asynchronous systems to have the timing of one system track the timing of a reference system. For example, when two asynchronous systems pass data between each other, it is desirable to have the timing of one system track the timing of the other system to facilitate reduced-error data transfer. In other cases, although no data may be transferred, it may be desirable for the outputs of the two systems (and therefore the timing of the two systems) to track each other, as in the simultaneous transmission of associated audio and video from separate audio and video systems.

Phase-locked loops (PLLs) are well known in the art for tightly locking the timing source of a slave or secondary system to the timing source of a reference system. However, the PLL may lock the timing sources so tightly that irregularities in the timing source of the reference system may appear in the timing signals produced by the secondary system. Therefore, in certain applications, it is preferable to have the timing source of the secondary system "track" the timing source of the reference system, but not be tightly "locked" to it, in order to produce more stable timing within the tracking system.

Figure 9:
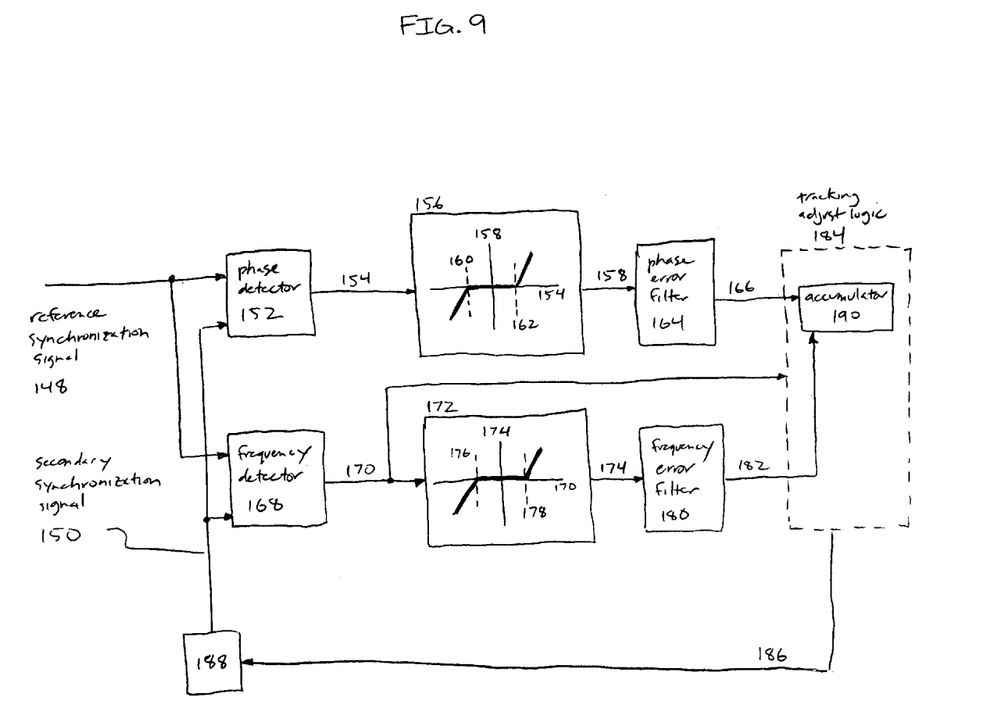
FIG. 9 is a block diagram of a system for tracking a secondary system to a reference system in a manner that accommodates irregularities in the timing source of the reference system while maintaining a stable output in the secondary system according to an embodiment of the present invention.

FIG. 9 is a block diagram of a system for tracking a secondary system to a reference system in a manner that accommodates irregularities in the timing source of the reference system while maintaining a stable output in the secondary system according to an embodiment of the present invention. Referring to FIG. 9, reference synchronization signal 148 and secondary synchronization signal 150 are communicated to phase detector 152, which generates a representation of a phase difference 154 between the reference synchronization signal 148 and secondary synchronization signal 150.

Phase difference 154 is then communicated to phase transfer block 156, which maps the phase difference 154 to a phase error signal 158. In preferred embodiments, phase transfer block 156 produces no phase error signal 158 when phase difference 154 is between a phase underflow value 160 and a phase overflow value 162, produces a negative phase error signal 158 when phase difference 154 is less than the phase underflow value 160, and produces a positive phase error signal 158 when phase difference 154 is greater than the phase overflow value 162. Such a mapping is known as a coring transfer function. The net effect of this coring transfer function is that no phase correction will be made if the phase error is within certain limits, but a phase correction will be made if the phase error is outside those limits. The phase error signal 158 is then communicated to phase error filter 164, which filters phase error signal 158 and produces a filtered phase error signal 166.

Similarly, reference synchronization signal 148 and tracking synchronization signal 150 are communicated to frequency detector 168, which generates a representation of an instantaneous frequency difference 170 between reference synchronization signal 148 and tracking synchronization signal 150. Instantaneous frequency difference 170 is then communicated to frequency transfer block 172, which maps the instantaneous frequency difference 170 to a frequency error signal 174. In preferred embodiments, frequency transfer block 172 produces no frequency error signal 174 when the instantaneous frequency difference 170 is between a frequency underflow value 176 and a frequency overflow value 178, produces a negative frequency error signal 174 when instantaneous frequency difference 170 is less than the frequency underflow value 176, and produces a positive frequency error signal 174 when instantaneous frequency difference 170 is greater than the frequency overflow value 178. The net effect of this coring transfer function is that no frequency correction will be made if the frequency error is within certain limits, but a frequency correction will be made if the frequency error is outside those limits. The frequency error signal 174 is then communicated to frequency error filter 180, which filters frequency error signal 174 and produces a filtered frequency error signal 182.

Filtered phase error signal 166, filtered frequency error signal 182, and instantaneous frequency difference 170 are communicated to tracking adjust logic 184, which generates a frequency adjustment control signal 186. Frequency adjustment control signal 186 is then communicated to secondary system 188 for controlling the timing of secondary system 188 and secondary synchronization signal 150.

In preferred embodiments of the present invention, within tracking adjust logic 184 is an accumulator 190 which accumulates the filtered phase error signal 166 and the filtered frequency error signal 182 over time and generates the frequency adjustment control signal 186. In conventional PLLs, the frequency adjustment control signal 186 is adjusted even after the phase error has been eliminated, until the phase error has also been eliminated. However, in embodiments of the present invention, a frequency adjustment control value may or may not be allowed to accumulate in accumulator 190, depending on trends in the elimination of frequency error.

In general, the phase error filter 164 and frequency error filter 180 provide memories that allow for a comparison of the instantaneous frequency difference 170 to an average phase or frequency difference accumulated over the past few samples to detect when a frequency error in a certain direction has been eliminated. In addition, it can be determined when sufficient frequency adjustments have been made in one direction such that further adjustments in that direction are unnecessary. The direction (positive or negative) of the instantaneous frequency difference 170 is compared to the sign of the filtered phase error signal 166 and to the sign of the filtered frequency error signal 182. Depending on those comparisons, the frequency adjustment control value stored in accumulator 190 will be incremented by both the filtered phase error signal 166 and the filtered frequency error signal 182, or by one but not the other, or by neither of these filtered error signals.

Within tracking adjust logic 184, the filtered phase error signal 166 is compared to the instantaneous frequency difference 170. If the filtered phase error signal 166 indicates that the secondary synchronization signal 150 is lagging the reference synchronization signal 148, and if the instantaneous frequency difference 170 indicates that the frequency of the secondary synchronization signal 150 is less than the frequency of the reference synchronization signal 148, the phase error should increase over time. Similarly, if the filtered phase error signal 166 indicates that the secondary synchronization signal 150 is leading the reference synchronization signal 148, and if the instantaneous frequency difference 170 indicates that the frequency of the secondary synchronization signal 150 is greater than the frequency of the reference synchronization signal 148, the phase error should also increase over time (in the opposite direction). In either case, the filtered phase error signal 166 is added into the accumulator 190, and the frequency adjustment control signal 186 is correspondingly adjusted to modify the timing of secondary system 188 and cause a decrease in the frequency difference between the secondary system 188 and the reference system.

If, on the other hand, the filtered phase error signal 166 indicates that the secondary synchronization signal 150 is lagging the reference synchronization signal 148, and if the instantaneous frequency difference 170 indicates that the frequency of the secondary synchronization signal 150 is greater than the frequency of the reference synchronization signal 148, the phase error should decrease over time. Similarly, if the filtered phase error signal 166 indicates that the secondary synchronization signal 150 is leading the reference synchronization signal 148, and if the instantaneous frequency difference 170 indicates that the frequency of the secondary synchronization signal 150 is less than the frequency of the reference synchronization signal 148, the phase error should decrease over time. With either trend, the accumulator 190 is not incremented by the filtered phase error signal 166, so the frequency adjustment control signal 186 is not changed and no adjustment will be made to the timing of the secondary system 188.

In addition, within tracking adjust logic 184, the filtered frequency error signal 182 is compared to the instantaneous frequency difference 170. If the filtered frequency error signal 182 indicates that the frequency of the secondary synchronization signal 150 is less than the frequency of the reference synchronization signal 148, and if the instantaneous frequency difference 170 provides the same indication, the frequency error has not been eliminated or reversed in direction. Similarly, if the filtered frequency error signal 182 indicates that the frequency of the secondary synchronization signal 150 is greater than the frequency of the reference synchronization signal 148, and if the instantaneous frequency difference 170 provides the same indication, the frequency error has not been eliminated or reversed in direction. With either trend, the filtered frequency error signal 182 is added into the accumulator, and the frequency adjustment control signal 186 is adjusted to modify the timing of secondary system 188 and cause a decrease in the frequency difference between the secondary system 188 and the reference system.

If, on the other hand, the filtered frequency error signal 182 indicates that the frequency of the secondary synchronization signal 150 is less than the frequency of the reference synchronization signal 148, and if the instantaneous frequency difference 170 indicates that the frequency of the secondary synchronization signal 150 is greater than or equal to the frequency of the reference synchronization signal 148, the frequency error has been eliminated or reversed in direction. Similarly, if the filtered frequency error signal 182 indicates that the frequency of the secondary synchronization signal 150 is greater than the frequency of the reference synchronization signal 148, and if the instantaneous frequency difference 170 indicates that the frequency of the secondary synchronization signal 150 is less than or equal to the frequency of the reference synchronization signal 148, the frequency error has been eliminated or reversed in direction. With either trend, the accumulator 190 is not incremented by the filtered frequency error signal 182, so the frequency adjustment control signal 186 is not changed and no adjustment will be made to the timing of the secondary system 188.

A previous section entitled "Description of Related Art" focused primarily on video encoders and video decoders to illustrate one example of the need to track the timing of asynchronous systems in a manner that accommodates timing irregularities in the reference system while maintaining a stable output in the secondary system. For purposes of simplifying the discussion, the following discussion also focuses primarily on video encoders and video encoders. However, it must be emphasized that embodiments of the present invention may be applicable whenever a secondary system must track a reference system. Thus, although the following discussion describes embodiments of the present invention with regard to a video signal processing system with video timing signals such as $V_{sync}$, $H_{sync}$, $V_{active}$, $H_{active}$ and video concepts such as lines and fields, other applications with functionally similar timing signals also fall within the scope of the present invention.

Modern video signal processing systems often combine audio, video, and graphics for viewing on a video display device. In such multi-media systems, graphics information must be integrated into the audio and video information present within an analog video signal. Overlaying graphics information onto the video signal is often more easily accomplished in the digital domain. Thus, it is desirable to decode the analog video signal into digital form, integrate the graphics information, and encode the combined signal back into an analog form compatible with typical video display devices.

In such systems, a video decoder first receives the analog video signal and converts it to digital information. The output of the video decoder may be comprised of signals like $V_{active}$, $H_{active}$, parallel pixel data, a field signal indicating whether the pixel data came from an even or odd field, and a clock signal. The video decoder outputs are then received by a video encoder, where the pixel data is written into a first-in-first-out (FIFO) buffer using the timing signals and clock signals received from the video decoder. The contents of the FIFO buffer are read out of the buffer using a clock slaved, but not tightly locked, to the timing signals received from the video decoder. This clock may also be used to clock graphics information into the video encoder. The pixel data is then integrated with the graphics information and converted back into analog form to be compatible with typical video display devices.

The asynchronous relationship between the video decoder and encoder may create timing problems as data from the video decoder is written into the FIFO buffer while data is being read out of the FIFO buffer. As the write clock from the video decoder drifts with respect to the read clock generated in the video encoder, the read and write pointers to the FIFO buffer may cross, resulting in dropped or repeated data.

The present invention minimizes these effects by adjusting the timing of the clock within the video encoder to track the timing of the video decoder. This tracking helps to minimize the size of the FIFO buffer required to eliminate data dropping, data repeating, and associated tearing artifacts, without changing the encoder clock frequency in a manner that would degrade the encoded video quality.

Figure 10:
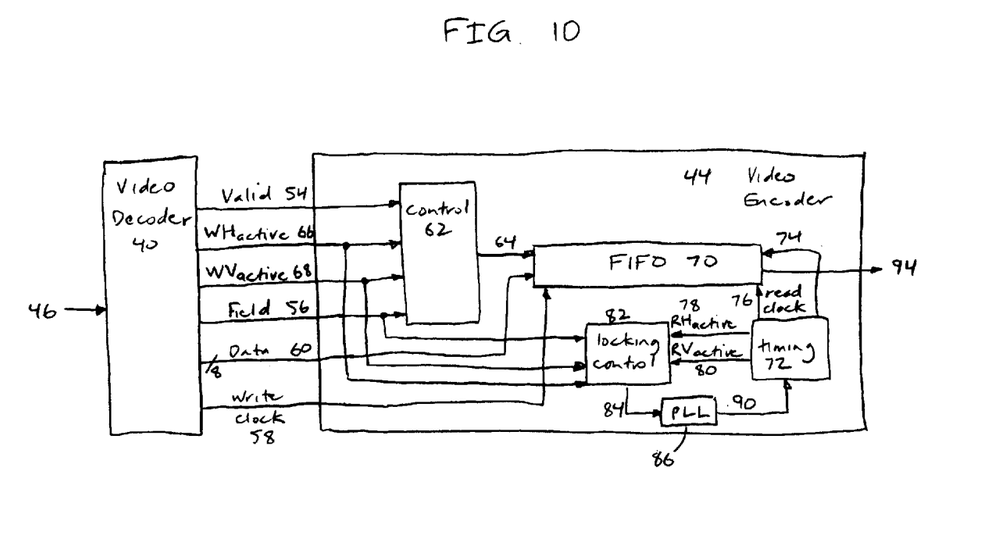
FIG. 10 is a block diagram of a video processing system according to an embodiment of the present invention.

FIG. 10 illustrates the interface between the video decoder and the video encoder in a preferred embodiment of the present invention. In FIG. 10, an analog video signal 46 is communicated to a video decoder 40. In one alternative embodiment, video decoder 40 is a Brooktree BT835 video decoder. Video decoder 40 communicates several signals to a video encoder 44. These signals may include a valid signal 54, a "write" $H_{active}$ signal ($WH_{active}$) 66, a "write" $V_{active}$ signal ($WV_{active}$) 68, a field signal 56 indicating whether the pixel data came from an even or odd field, a write clock 58, and in one alternative embodiment, 8 bits of parallel pixel data 60.

Within video encoder 44, $WH_{active}$ 66, $WV_{active}$ 68, valid signal 54, and field signal 56 are communicated to a control block 62. An output of control block 62 is a write pointer 64. Write pointer 64, pixel data 60, and write clock 58 are communicated to a FIFO 70. Timing block 72 communicates a read pointer 74 and a read clock 76 to FIFO 70, and communicates a "read" $H_{active}$ signal ($RH_{active}$) 78 and a "read" $V_{active}$ signal ($RV_{active}$) 80 to locking control 82. Locking control 82 receives $WH_{active}$ 66, $WV_{active}$ 68, $RH_{active}$ 78, $RV_{active}$ 80, and field signal 56 as inputs, detects a phase difference and a frequency difference between these signals, and produces a PLL control signal 84 to a PLL 86 within video encoder 44. PLL 86 communicates a read clock control signal 90 to timing block 72.

In the embodiment of FIG. 10, The 8 bits of parallel pixel data 60 communicate data describing each pixel. Different color spaces may be used to represent the color values. RGB is one color space. RGB can be converted to another color space, YUV, which is typically the basis of the analog encoded signal. The values of R, G, and B range from 0 (no color) to 1 (maximum color). RGB color space can be converted to YUV color space as follows: Y=0.299R+0.587G+0.114B, U=B-Y, and V=R-Y. For 8-bit data streams, pixel data 60 is in a $YC_RC_B$ 4:2:2 format, including 8 bits of luminance data (the "Y" component), 8 bits of CR data (the red or "V" component), and 8 bits of $C_B$ data (the blue or "U" component).

Video decoder 40 receives analog video signal 46, digitizes it, separates the luminance component Y from the chrominance component, and demodulates the chrominance component (which is a quadrature AM modulated signal for NTSC) into two components, U and V. Thus, at one point in video decoder 40 each of the pixels within one line are defined in terms of a total of 24 bits of Y, U, and V data. The U and V data are then transformed to generate $C_R$ and $C_B$ data, scaled to a particular pre-defined range.

For example, in one embodiment of the present invention the initial U and V values have a range of approximately ±68 or ±78, respectively, while the $C_R$ and $C_B$ values have a range of approximately ±112 (where 0 represents no color, −112 represents the maximum color saturation in one direction, and ±112 represents the maximum color saturation in the other direction). Thus, a gain must be applied to spread the U and V values out to the range of the $C_R$ and $C_B$ values. Similarly, the initial Y value has a range of 0 to 130, and the Y component of the $YC_RC_B$ format has a range from black to white of 16 to 235. Thus, a gain must be applied to generate the $YC_RC_B$ values. "4:2:2" format is defined as representing each pixel by a total of 24 bits of $YC_RC_B$ data, with the $C_R$ and $C_B$ values dropped for every other pixel. Thus, one pixel is represented by 24 bits of $YC_RC_B$ data, the next pixel is represented by only 8 bits of Y data, and the next pixel is represented by 24 bits of $YC_RC_B$ data, etc. However, only 8 bits are output at a time. A 16-bit mode is also supported, where 16 bits are output at each clock, 8 bits are luminance, the other 8 bits are multiplexed between $C_R$ and $C_B$.

A write clock 58 may be generated at twice the pixel frequency, resulting in two clocks per pixel. By clocking out 8 bits of parallel pixel data 60 on each write clock edge, 16 bits of information are communicated per pixel. Alternatively, a write clock may be generated at the pixel frequency, resulting in one clock per pixel. By clocking out 16 bits of parallel pixel data on each write clock edge, 16 bits of information are communicated per pixel.

In one alternative embodiment of the present invention, a line-locked approach to video decoding is employed where the video decoder sampling clock is line-locked to the $H_{syncs}$ on incoming analog video signal 46. When timing anomalies on $H_{sync}$ are encountered, video decoder 40 will continue to produce the same number of video decoder sampling clock edges per line, but the frequency of the video decoder sampling clock will vary to achieve the required tracking.

In another alternative embodiment of the present invention, a scaled approach to video decoding is employed. In the scaled approach, incoming analog video signal 46 may be sampled with a stable asynchronous video decoder sampling clock at eight times the reference subcarrier frequency. For NTSC, therefore, the video decoder sampling clock is approximately 8×3.579545 MHz=28.636 MHz. In the digital domain, this frequency is decimation filtered down to 14.318 MHz, producing a total of 754 samples during $H_{active}$. Digital signal processing (DSP) and interpolation may then be used to compute a sequence of desired phases between the sampled data points representing the data points that would have been sampled if a line-locked clock had been used. The net result is that the 754 pixels of sampled data is scaled down to 720 pixels, an effective pixel rate of 13.5 MHz.

For NTSC, write clock 58 communicated from video decoder 40 to video encoder 44 is 14.318 MHz, and thus within $H_{active}$ there will be 754 write clock edges. However, because there are only 720 scaled data points to be communicated to video encoder 44, some write clock edges will have no pixel data associated with it (an invalid write clock). There will be 34 such invalid write clocks interspersed periodically over the $H_{active}$ time period. Thus, a valid signal 54 is generated by video decoder 40 to indicate when write clock 58 is valid.

VCRs are unstable video sources that do not generate consistent $H_{syncs}$. The time between successive $H_{syncs}$ may vary by ±2 to 4 pixels per line. Additionally, in VCRs a head switch line is encountered at the bottom of each field, substantially different in length from the other lines in the field. When such timing anomalies are encountered, a line-locked video decoder will produce the same number of video decoder sampling clocks per line, but the video decoder sampling clock frequency will vary to achieve the required tracking. By comparison, the scaled video decoder will produce a varying number of video decoder sampling clocks per line, but the video decoder sampling clock frequency will remain unchanged. In either case, data representing 720 pixels will be communicated during each line.

Embodiments of the present invention accommodate either conventional line-locked or scaled video decoders, as described above. Referring again to FIG. 10, parallel pixel data 60 from video decoder 40 is written into FIFO 70 using write clock 58. Timing block 72 generates read pointer 74 and read clock 76 to read pixel data 94 out of FIFO 70, and generates timing signals necessary to recreate the analog waveform. Because read clock 76 is not tightly locked to write clock 58, there are essentially two different clock domains, with FIFO 70 spanning the two domains.

Regardless of the frequency instability of analog video signal 46, the type of video decoder 40 employed, and the two different clock domains, in embodiments of the present invention video encoder 44 will generate a relatively stable output (each line will be approximately the same length). By making only small adjustments to read clock 76 in response to timing signals from video decoder 40, a mathematically linked subcarrier (MLS) may be generated, with the same number of clocks per line occurring at approximately the same time per line (within the precision of the integer arithmetic inside the encoder).

An advantage of keeping the reference subcarrier mathematically linked to the $H_{syncs}$ is that comb filtering (a means for doing Y–C separation) is most effective with an MLS. The simplest form of comb filtering takes one line of chrominance and the previous line of chrominance and averages them together. In NTSC video signals there are 227.5 subcarrier cycles per line, so from one line to the next the subcarrier phase will be shifting by 180°. Thus, if the chrominance content is identical in both lines, the chrominance components would cancel out and only luminance components that had gotten into the chrominance channel would remain. This recovered luminance could be added back into the luminance channel.

Similarly, if the chrominance component of the previous line is inverted and added to the chrominance component of the current line, any luminance passing through the chrominance channel will be canceled and only the chrominance component will remain. For this technique to work optimally, the subcarrier phase alignment should be the same from line to line. Thus, if the reference subcarrier is not an MLS (say, 227.6 subcarrier cycles per line), there will be an offset of 0.1 cycles from line to line, and when the comb filter performs Y–C separation, the phase difference will interfere with the performance of the filter. Embodiments of the present invention, having a video encoder slaved, but not tightly line-locked to video decoder timing, adjust the video encoder's PLL in very small increments very slowly over time so that a MLS can be produced which will optimize the performance of comb filters in display devices.

Frequency Tracking

As described above, in embodiments of the present invention read clock 76 is not tightly locked to the timing signals from video decoder 40, but nevertheless does track the video decoder timing. To accomplish this frequency tracking, embodiments of the present invention may employ one or more of the following tracking modes: post-synchronization tracking, semi-accelerated tracking, and accelerated tracking.

Post-Synchronization Tracking

Even after video decoder 40 and video encoder 44 have achieved a degree of synchronization, some drift will occur because the video encoder timing is not tightly locked to the video decoder timing. The post-synchronization tracking mode is designed to detect this post-synchronization drift by establishing underflow and overflow "warning thresholds" and determining if one of these thresholds has been crossed due to the frequency drift of the video encoder timing. If a threshold is crossed, PLL 86 is adjusted, at most once every field, to reverse the drift. Drift is detected and corrected by locking control block 82, which monitors FIFO 70 and adjusts PLL 86 if a threshold is crossed.

Figure 11:
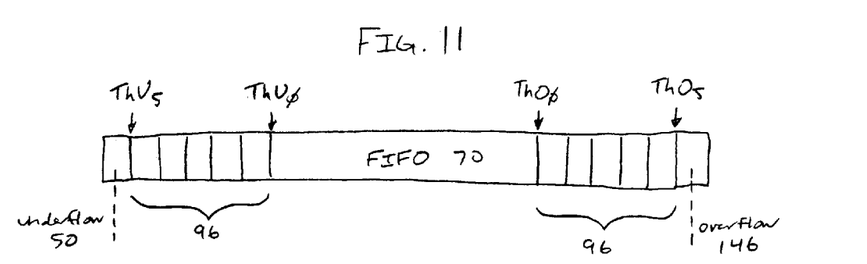
FIG. 11 is a block diagram of a first-in-first-out (FIFO) memory with threshold underflow and overflow bumpers according to an embodiment of the present invention.

In one embodiment of the present invention, FIFO 70 is a sequential memory with independent read and write pointers capable of storing 384 pixels. FIG. 11 is a block diagram representation of FIFO 70, including threshold settings (bumpers) 96 symbolically indicated on the right and left ends of FIFO 70. In the example of FIG. 11, there are six threshold underflow bumpers $ThU_0$–$ThU_5$ and six threshold overflow bumpers $ThO_0$–$ThO_5$. It should be noted, however, that in alternative embodiments of the present invention, any number of bumpers may be employed. Each bumper represents a particular number of pixels within FIFO 70, and is also associated with a particular frequency adjustment value. When the post-synchronization tracking mode is first entered, the "lowest" bumpers $ThU_0$ and $ThO_0$ are established as the "active" underflow and overflow bumpers, respectively.

Locking control 82 then effectively determines the number of pixels that were written into FIFO 70 (how "full" the FIFO was) at the time video encoder 70 reads the first pixel from FIFO 70 at the beginning of each line (a "fullness" value). In preferred embodiments of the present invention, this fullness value is determined by comparing the timing of the $WH_{active}$ and $RH_{active}$ signals at each line. From this timing, the fullness of the FIFO can be estimated. However, it should be noted that in alternative embodiments, the fullness value may be estimated by comparing the timing of other video decoder and video encoder timing signals, such as, but not limited to, $WH_{sync}$ and $RH_{sync}$, or the read and write pointers. This fullness value is determined for every line in an entire field, and the minimum and maximum fullness values over an entire field are noted.

It should be emphasized that monitoring the fullness value of the FIFO is just a means of determining the difference between the input (e.g. decoder) timing and output (e.g. encoder) timing. Alternative methods may be used, and in non-analog video embodiments other timing signals may be employed, but it is the timing difference that needs to be controlled such that it remains within an acceptable range while still providing stable output timing. If the system includes a FIFO in the interface between the reference timing domain and the slave (i.e. tracking) timing domain, then the acceptable range will be one that avoids overflows and underflows of that FIFO.

The minimum and maximum fullness values are then compared to the active threshold underflow and overflow bumpers to determine if the minimum fullness value is less than the active threshold underflow bumper, or if the maximum fullness value exceeds the active threshold overflow bumper. If the threshold underflow bumper was "crossed," locking control 82 makes a frequency adjustment to the PLL 86 associated with the active threshold underflow bumper. Similarly, if the threshold overflow bumper was "crossed," locking control 82 makes a frequency adjustment to the PLL 86 associated with the active threshold overflow bumper. This adjustment is therefore made only once every field.

The active threshold underflow and overflow bumpers are then re-designated. If, for example, $ThU_0$ was crossed, the next highest bumper $ThU_1$ is then re-designated as the new active threshold underflow bumper, and regardless of current active threshold overflow bumper, the new active threshold overflow bumper is set to $ThO_0$. More generally, if $ThU_n$ was crossed, $ThU_{n+1}$ becomes the new active threshold underflow bumper, and $ThO_0$ becomes the new active threshold overflow bumper. Similarly, if $ThO_n$ was crossed, $ThO_{n+1}$ becomes the new active threshold overflow bumper, and $ThU_0$ becomes the new active threshold underflow bumper. With the new active threshold underflow and overflow bumpers redesignated, new minimum and maximum fullness values for the next field are determined, bumper "crossings," if any, are determined, and the adjustment process, if any, is repeated.

Conceptually, the post-synchronization tracking mode makes adjustments to the PLL when the threshold bumpers are exceeded in either direction in an attempt to keep the fullness value between the values for bumpers $ThU_0$ and $ThO_0$. For example, if pixel data is being read out of FIFO 70 faster than data is written into FIFO 70, the fullness value will "drift" to the left (i.e. get smaller) until it exceeds the active threshold underflow bumper, and a small decrease in the read clock frequency will be made. If the adjustment is enough to "turn around" the drift in the other direction, pixel data will be written into FIFO 70 faster than data is read out of FIFO 70 and the fullness value will begin to drift to the right. Eventually, the fullness value will exceed the active threshold overflow bumper, and a small increase in the write clock frequency will be made. The net effect is that the fullness value will "bounce" back and forth between the bumpers.

Figure 12:
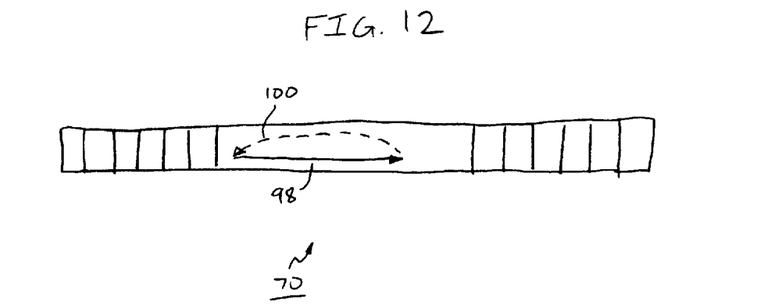
FIG. 12 is a block diagram of a FIFO memory illustrating the shift in a fullness value due to a head switch line.

It should be noted in the example of FIG. 11 that although no tearing will actually occur until FIFO 70 actually underflows or overflows, by keeping the fullness value within $ThU_0$ and $ThO_0$ a safety margin is maintained. This safety margin may be of importance, for during VCR head switches where most of the lines in a field are slightly shorter than nominal and one line is much longer than nominal, the short lines in the field will cause pixel data 60 to be written into FIFO 70 faster than pixel data is read out of FIFO 70. FIG. 12 illustrates that as this occurs, FIFO 70 will be getting increasingly full at each read (the fullness value will be moving towards an overflow condition; see reference character 98). When the one long line is encountered, the long line will delay the writing of pixel data 60 associated with the next successive line, and FIFO 70 will become less full by the first read of that next line (the fullness value will jump back towards an underflow condition; see reference character 100). If the fullness value is not maintained within $ThU_0$ and $ThO_0$ by post-synchronization tracking, head switch lines might otherwise cause FIFO 70 to underflow or overflow, resulting in tearing.

As described above, each bumper 96 is associated with a particular frequency adjustment value. In preferred embodiments of the present invention, larger adjustments will be made by the higher bumpers under the assumption that the higher bumpers will be crossed when the adjustments associated with the lower bumpers are insufficient to turn around the drift. Severe drift may occur during startup (initial synchronization) when read clock 76 may be significantly off frequency from write clock 58. Proper selection of the schedule of adjustment values for the bumpers will minimize the duration of substantial frequency differences which create underflows, overflows or situations where the PLL would be pulled off frequency enough to cause large shifts in the subcarrier phase which will cause hue errors in the display image. However, it should be noted that a schedule of adjustment values with larger adjustments being assigned to the higher bumpers is not necessary to create a stable system.

To ensure that the post-synchronization tracking mode produces a stable tracking system with minimal frequency adjustments, in preferred embodiments of the present invention the adjustment associated with any particular threshold underflow bumper $ThO_n$ should be no larger than the sum of the adjustments associated with $ThU_{n-1}$ through $ThU_0$. Similarly, the adjustment associated with any particular threshold overflow bumper $ThO_n$ should be no larger than the sum of the adjustments associated with $ThO_{n-1}$ through $ThO_0$. If a particular bumper exceeds these restrictions, the adjustment associated with that bumper could cause the read clock frequency to be pulled so far from nominal that the fullness value will drift in the opposite direction and exceed higher bumpers on the other side. For example, if the adjustment associated with $ThU_2$ was greater than the sum of the adjustments associated with $ThU_1$ and $ThU_0$, the adjustment associated with $ThU_2$ could cause the fullness value to drift in the opposite direction until it exceeded $ThO_2$ or higher. Thus, rather than eventually settling to bouncing between the smallest bumpers $ThU_0$ and $ThO_0$, the adjustments in such a system may continue to bounce between larger bumpers with their larger frequency adjustments.

In preferred embodiments of the present invention, the bumper values and their associated schedule of adjustments are fixed. In alternative embodiments, the bumpers are programmable and symmetric. Bumpers are symmetric if, when the threshold value of $ThU_n$ is less than some nominal fullness value by an amount X, then $ThO_n$ is greater than the nominal fullness value by the amount X. In addition, if the adjustment associated with $ThU_n$ slows read clock 76 by Y ppm, then $ThO_n$ speeds up read clock 76 by Y ppm.

It should be understood that the post-synchronization tracking mode described above corresponds to the phase detector path in the generalized block diagram of FIG. 9. In post-synchronization tracking, the drift must exceed a certain threshold before an adjustment will be made, which corresponds to the phase underflow value 160 and the phase overflow value 162 of phase transfer block 156. As discussed above, larger drift results in larger adjustments, which corresponds to the larger phase error values indicated by the coring transfer function outside the phase underflow value 160 and the phase overflow value 162. Additionally, if one threshold bumper is crossed and an adjustment is made sufficient to reverse the sign of the frequency error, the drift will reverse direction, and no further adjustments will be made until a threshold bumper is crossed on the other end of FIFO 70. In the generalized block diagram of FIG. 9, this corresponds to comparing the filtered phase error signal 166 and the instantaneous frequency difference 170 in the tracking adjust logic 184, and not incrementing accumulator 190 by the filtered phase error signal 166 when the instantaneous frequency difference 170 is in the direction that will reduce the phase error, so that no further adjustment will be made to the timing of the secondary system 188.

Semi-Accelerated Frequency Tracking

In addition to the post-synchronization tracking mode, a semi-accelerated frequency tracking mode may be employed to allow drift to be tracked by making small adjustments spread out over time (once every five to eight fields). Certain VCRs have field rate variations over time that cause large frequency drifts. For VCRs and other video sources where the field rate is varying, the small, spread-out adjustments of the semi-accelerated frequency tracking mode minimize the occurrence of a temporary hue shift in the output image.

To determine when the semi-accelerated frequency tracking mode is triggered, a "fullness value" is determined (the number of pixels -that were written into FIFO 70 at the time video encoder 70 reads the first pixel from FIFO 70 at the beginning of each line) at the first active line of a field. This fullness value is compared to the fullness value of the previous field, if any, the difference between the two values providing an indication of the total drift that occurred during the previous field. If the accumulated drift exceeds a predefined drift threshold, a large frequency adjustment is needed, and the semi-accelerated frequency tracking mode is triggered. If the threshold is not exceeded, the drift value is again accumulated at the first active line of the next field, and the accumulated drift is again compared to the threshold. This accumulation process continues for up to four consecutive fields. If, at any time, the threshold is exceeded, the semi-accelerated frequency tracking mode is initiated. For example, if the fullness value increases by seven pixels every field, the drift value for every field will be +7 pixels. After three fields, the accumulated drift value will be +21 pixels. If the drift threshold is ±18 pixels, then after three fields the drift threshold is exceeded and the semi-accelerated frequency tracking mode is initiated. It should be noted that in preferred embodiments of the present invention both the drift threshold and the maximum number of fields for accumulating the drift value are fixed. However, in alternative embodiments the drift value may be accumulated over a number of fields greater than four, and both the drift threshold and the maximum number of fields for accumulating the drift value may be programmable or otherwise selectable.

Once the semi-accelerated frequency tracking mode is entered, the previous accumulated drift value is reset to zero, and a new drift value is again computed at the first line of the next field. If the polarity of the new drift value is the same as the polarity of the previous accumulated drift value, then the new drift value is multiplied by a gain factor (in ppm/pixel), and that amount of frequency adjustment is made to the PLL. For example, assume that in an alternative embodiment of the present invention, the gain factor is ⅜ ppm/pixel, and the semi-accelerated frequency tracking mode was entered because of a positive drift of +21 pixels. If the new drift value is +7 pixels, the adjustment to be made is an increase in the read clock frequency of (7 pixels)×(⅜ ppm/pixel)=2⅝ ppm. In one embodiment of the present invention, after the adjustment is made, the semi-accelerated frequency tracking mode ends immediately. In an alternative embodiment, a delay of three additional fields occurs before the semi-accelerated frequency tracking mode ends. Further alternative embodiments allow the selection of either the immediate or delayed end to the semi-accelerated frequency tracking mode.

Once the semi-accelerated frequency tracking mode is terminated, a new drift value is accumulated over up to the next four consecutive fields, and if the accumulated drift exceeds a predefined drift threshold, the semi-accelerated frequency tracking mode is once again entered. It should be noted that in preferred embodiments of the present invention, the gain factor is fixed, and in alternative embodiments, the gain factor is programmable or otherwise adjustable.

Accelerated Frequency Tracking

An accelerated frequency tracking mode may be triggered if an underflow or overflow condition is detected, or if a change in video source requires a line count synchronization. These conditions may occur due to a change in the video source input to the decoder or to a large frequency error following such a change. Under such large frequency error conditions, the accelerated frequency tracking mode allows drift to be tracked quickly by making adjustments over four consecutive fields.

In preferred embodiments of the present invention, a FIFO underflow condition exists if the fullness value is less than an underflow threshold 50 located halfway between the highest threshold underflow bumper and the end of FIFO 70 (see FIG. 11), and a FIFO overflow condition exists if the fullness value is greater than an overflow threshold 146 located halfway between the highest threshold overflow bumper and the end of FIFO 70 (see FIG. 11), but less than the depth of FIFO 70. It should be noted that in alternative embodiments, the underflow and overflow thresholds may be set to other limits, such as, but not limited to, the highest threshold underflow and overflow bumpers.

In addition, extreme overflows wherein the fullness value exceeds the depth of FIFO 70 must be evaluated, for such overflows may either be categorized as FIFO overflows or underflows. In preferred embodiments, if the fullness value is greater than the FIFO depth, but less than the FIFO depth plus half of the difference between the FIFO depth and the line length, then an overflow condition exists. If the fullness value is greater than FIFO depth plus half of the difference between the FIFO depth and the line length, then an underflow condition exists. It should be noted that in alternative embodiments, the splitting of the extreme overflow condition into distinct underflow and overflow conditions may be divided in other ways.

If an overflow or underflow condition is determined and the accelerated frequency tracking mode is entered on that basis, the drift value is computed and accumulated (as in the semi-accelerated frequency tracking mode) at the first line of each field over the next four consecutive fields. For each of the four fields, if the polarity of the new drift value is the same as the polarity of the accumulated drift value, the accumulated drift value is multiplied by a gain factor (in ppm/pixel), and that amount of frequency adjustment is made to the PLL in the video encoder. For example, assume that in one embodiment of the present invention, the gain factor is ⅜ ppm/pixel, and the accelerated frequency tracking mode was entered because of an underflow condition. If, after the first field, the accumulated drift is −5 pixels, the drift value for the first field is −5 pixels and the adjustment to be made is a decrease in the read clock frequency of (5 pixels)×(⅜ ppm/pixel)=1⅞ ppm. If, after the second field, the accumulated drift is −8 pixels, the drift value for the second field is −3 pixels and the adjustment to be made is a decrease in the read clock frequency of (8 pixels)×(⅜ ppm/pixel)=3 ppm. If, after the third field the accumulated drift is −7 pixels, the drift value for the third field is +1 pixels and no adjustment is made. These adjustments, if any, are made for four consecutive fields, at which time the accelerated mode ends. It should be noted that in preferred embodiments of the present invention, the gain factor is fixed, and in alternative embodiments, the gain factor is programmable or otherwise adjustable.

It should be understood that the semi-accelerated and accelerated tracking modes described above correspond to the frequency detector path in the generalized block diagram of FIG. 9. In semi-accelerated and accelerated tracking, the drift must exceed a certain drift threshold before an adjustment will be made, which corresponds to the frequency underflow value 176 and frequency overflow value 178 of frequency transfer block 172. As described above, larger drift results in larger adjustments, which corresponds to the larger frequency error values indicated by the coring transfer function outside the frequency underflow value 176 and the frequency overflow value 178. In addition, no adjustments will be made if the drift has reversed direction. In the generalized block diagram of FIG. 9, this corresponds to comparing the filtered frequency error signal 182 and the instantaneous frequency difference 170 in the tracking adjust logic 184, and not incrementing accumulator 190 by the filtered frequency error signals 182 when the frequency error has been eliminated or reversed, so that no further adjustment will be made to the timing of the secondary system 188.

Timing Control Signal Alignment

In addition to the frequency tracking modes described above, embodiments of the present invention may also make discrete adjustments to the encoder read timing control signals. Such adjustments may be needed during initial synchronization of the system when the system is first started or the source or channel is changed, situations where a break in timing occurs and new timing is applied. The new timing can start up at any time, so both horizontal and vertical timing must be addressed. To make these adjustments, embodiments of the present invention may employ one or more of the following alignment modes: horizontal alignment and vertical alignment.

Horizontal Alignment

Figure 13:
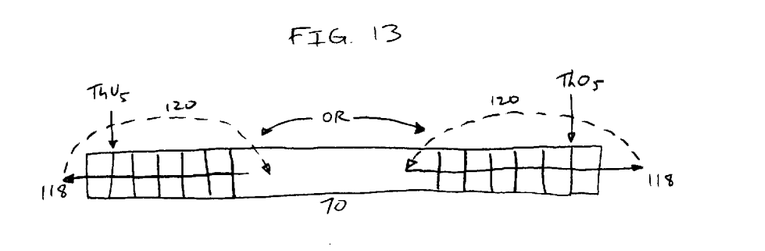
FIG. 13 is a block diagram of a FIFO memory element illustrating a tracking correction by a horizontal timing adjustment according to an embodiment of the present invention.

As illustrated in FIG. 13, if a timing change causes a large shift in the timing relationship between the write and read operations within a line, severe drift and almost immediate FIFO overflows or underflows may occur (see reference character 118). In addition, if the timing change causes a change in the frequency of the timing source, the resulting frequency error could also be large enough to cause a delayed FIFO underflow or overflow 118. When such an underflow or overflow 118 is detected, timing block 72 (see FIG. 10) performs a horizontal alignment to shift the video encoder's read timing by a predetermined number of pixels in the appropriate direction (see reference character 120 in FIG. 13). In preferred embodiments of the present invention, timing block 72 shifts the video encoder's read timing by 64 pixels. However, although the following description uses 64 pixels for purposes of illustration only, in alternative embodiments, adjustments of other than 64 pixels may also be made.

Figure 14:
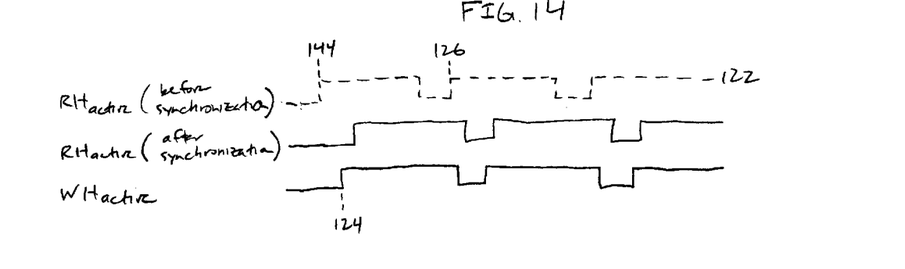
FIG. 14 is a timing diagram, not to scale, of the relationship of timing signal $WH_{active}$ to timing signal $RH_{active}$ before synchronization (dashed lines) and after a horizontal timing adjustment (solid lines) according to an embodiment of the present invention.

Since the write and read operations are asynchronous, during the initial synchronization phase no assumptions can be made regarding the relative positions of the beginning of the active line from the decoder timing domain versus that from the encoder timing domain. As illustrated by the dashed lines and reference character 122 in FIG. 14, when the system starts up after a break, and before synchronization is achieved, the beginning of $RH_{active}$ could occur at any time with respect to the beginning of $WH_{active}$. If it is shifted left, as indicated in FIG. 14 (see reference character 144), the write pixel counter will start counting at the rising edge of $WH_{active}$ (see reference character 124) and will stop counting at the next rising edge of $RH_{active}$ (see reference character 126). At that time, the fullness value will be almost equivalent to one line. Overflow or underflow (as described in the section on the accelerated frequency tracking mode) is then evaluated, and if an underflow or overflow condition is detected, the 64 pixel adjustment is made.

The 64 pixel adjustment 120 of FIG. 13 includes changing a read pixel counter and a subcarrier generator generated by video encoder 44 within timing block 72, but does not include an adjustment to the read pointer. The read pixel counter keeps track of how many pixels have been read within a particular line. The adjustment to the read pixel counter may be applied when the read pixel counter indicates that about one half of a line has already been read, ensuring that the read pixel counter can be adjusted by at least 64 pixels in either direction without disrupting other timing signals decoded from the read pixel counter. For example, after an underflow is detected and the read pixel counter indicates that the read timing is the middle of the next line (for example, at pixel 360), 64 is subtracted from the read pixel counter, changing its value to 296. The consequence of this change is that on the next line there will be a delay of 64 pixels before timing block 72 begins to read data out of FIFO 70. The net effect is that the video encoder's read timing is delayed, giving more time for the video decoder to write additional data into FIFO 70, and reducing the underflow condition.

The subcarrier phase generator is an accumulator that has a value added to it at each read clock that indicates how much of a subcarrier cycle has elapsed during that read clock period. For example, if the read clock was four times the subcarrier frequency, ¼ would be added into the accumulator at the end of each read clock. At the first read clock edge the accumulator would be 0, and at subsequent read clock edges the accumulator would be ¼, ½, ¾, 1 (which is the same as 0), etc. Thus, when an underflow or overflow 118 is detected, the read pixel counter is adjusted by a fixed amount (for example, 64) in the appropriate direction, and the subcarrier phase generator is adjusted by 64 clocks worth of increment in the appropriate direction.

The read pixel counter and subcarrier generator adjustments move the read timing of the entire line to a point that is either 64 read clocks after or prior to the current point in time. In addition, the active threshold bumpers are reset to the lowest bumpers $ThU_0$ and $ThO_0$. If subsequent fullness values indicate that an underflow or overflow condition still exists, then on successive lines the horizontal alignment process is repeated until an underflow or overflow 118 no longer exists. This horizontal timing adjustment allows the system to re-align quickly, over a few lines. It should be noted that although the post-synchronization frequency tracking mode and the accelerated mode are also triggered by drift, the post-synchronization frequency tracking mode and the accelerated mode adjustments occur, at most, once every field. In contrast, the horizontal alignment described herein may occur at every line until the underflow or overflow condition is eliminated, and typically the horizontal alignment process will commence and conclude within a field, simultaneously triggering the accelerated mode.

In another alternative embodiment of the present invention, more conservative underflow and overflow thresholds are identified by computing the midpoint between the threshold values of the lowest bumpers, $ThU_0$ and $ThO_0$, and the "ends" of the FIFO. For example, if the FIFO is 384 pixels deep, $ThU_0 = 32$, and $ThO_0 = 352$, then the underflow midpoint is $(32-0)/2=16$ and the overflow midpoint is $384-(384-352)/2=368$. If these thresholds have been exceeded, then an underflow or overflow condition exists. The reason for selecting more conservative underflow and overflow thresholds is that although underflow and overflow conditions are determined at the front edges of $WH_{active}$ and $RH_{active}$, there may still be some additional drift that occurs later within the line. This is especially true for VCRs with 2–4 pixels of variation per line. Without the more conservative thresholds, underflow or overflow conditions occurring later in the line might not be detected.

Vertical Alignment

In preferred embodiments of the present invention, the degree of synchronization between the video decoder write timing and the video encoder read timing is monitored during the first active line of every field, and, if necessary, an adjustment may be made to the encoder read timing control signals to improve the synchronization. Such adjustments may be needed when the source is a VCR in a special play mode, or during initial synchronization of the system when the system is first started or the source or channel is changed, situations where a break in timing occurs and new timing is applied.

Figure 15:
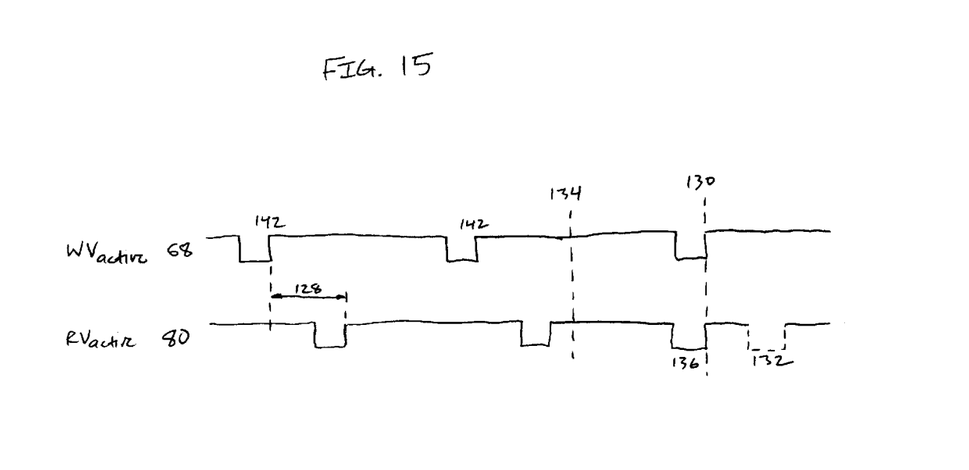
FIG. 15 is a timing diagram, not to scale, of the relationship of timing signal $WV_{active}$ to timing signal $RV_{active}$ before synchronization (dashed lines) and after a vertical timing adjustment (solid lines) according to an embodiment of the present invention.

Referring to FIG. 15, assume that the timing of the analog video signal source is suddenly changed so that $WV_{active}$ and $RV_{active}$ are no longer aligned, but rather the rising edge of $WV_{active}$ 68 is received prior to the rising edge of $RV_{active}$ 80. Without any adjustment, the misalignment of $WV_{active}$ and $RV_{active}$ will be maintained. However, in preferred embodiments of the present invention, the misalignment of $WV_{active}$ and $RV_{active}$ is quantified (see reference character 128), and that value is used to adjust the read line counter (which keeps track of the current read line and determines the next occurrence of $RV_{active}$ and other video encoder timing signals) in the following fields. The adjustment to the read line counter occurs at a predetermined number of lines plus some variable offset (which depends on the size of previous misalignments) after the rising edge of $WV_{active}$, designated as read line counter adjustment point 134. By forcing the read line counter to a preset line count at read line counter adjustment point 134, the next $RV_{active}$ will occur at reference character 136 instead of what is shown in dashed lines at reference character 132, and $RV_{active}$ 80 and $WV_{active}$ 68 will be re-aligned (see reference character 130). As a result, the video encoder timing will be re-synchronized with the video decoder timing. Vertical synchronization therefore allows the video encoder timing to be adjusted to generate the same nonstandard number of lines per field that are being received from the video decoder.

In addition, if the initial misalignment between $WV_{active}$ and $RV_{active}$ exceeds a predefined number of lines (e.g. 18), a timing anomaly (a change in channel or a change in source) has occurred, and a large frequency error may have to be eliminated. In preferred embodiments of the present invention, the accelerated frequency tracking mode is activated to eliminate this frequency error.

It should be noted that the preset read line count is dependent on whether the current field is an even or odd field, because the read line counter is actually counting a full frame, so the current field type (even or odd) is passed from the video decoder to the video encoder. In preferred embodiments of the present invention, 32 lines after the first active write line is the nominal value for both read line counter adjustment point 134 and the preset read line count. However, if the read line counter adjustment point 134 occurs during an even field, an entire field's worth of lines must be added to the nominal preset line count value. Thus, for example, if there are 262.5 lines in each field, and the read line counter adjustment point 134 occurs during an odd field, the read line counter will be forced to its nominal preset read line count value at read line counter adjustment point 134. However, if the read line counter adjustment point 134 occurs during an even field, the read line counter will be forced to its nominal preset read line count value plus 263 at read line counter adjustment point 134.

The location of read line counter adjustment point 134 is dependent on the non-standard line counts that may be generated by VCRs in special play modes. For example, if the tape speed of a normal play mode is defined as X, then in cue mode a typical VCR may generate 1.5 fewer lines per field for every multiple of X over the tape speed of the normal play mode, and in review mode a typical VCR may generate 1.5 more lines per field for every multiple of X under the tape speed of the normal play mode. Thus, if a VCR's cue tape speed is 11X, the difference between the cue tape speed and normal tape speed is X−11X=−10X, and this −10 X difference multiplied by 1.5 equals 15 fewer lines per field. If a VCR's review tape speed is −11X, the difference between the review tape speed and normal tape speed is −X−11X=−12X, and this −12X difference multiplied by 1.5 equals 18 more lines per field. Because conventional VCRs typically do not have cue or review modes greater than ±11X, if the difference in the line counter before and after the line counter reset is greater than 18, the difference in timing was likely not due to a VCR operating in a special play mode, but more likely due to a channel or source change. Therefore, in preferred embodiments of the present invention, to ensure that the read line counter can be adjusted by +15 lines or −18 lines without disrupting timing signals such as $RV_{active}$ which are derived from the read line counter, read line counter adjustment point 134 has a value greater than 18. Without such a requirement, if the read line counter were decremented by 18 at a time when the read line counter had a value of 18 or less, the derivation of $RV_{active}$ may be corrupted.

In preferred embodiments of the present invention, separate read line counter adjustment points 134 are maintained for even and odd fields, and the read line counter adjustment point 134 for either the even or odd fields, or both, can be adjusted to compensate for the special play modes of certain VCRs. For example, in the 2X play mode and pause mode of some VCRs, rather than generating fields having the same number of lines, the VCR may generate alternating fields of nominal length and four lines short of nominal length. To avoid having every other field misaligned by four lines, separate even and odd field read line counter adjustment points are maintained, and separate registers are allocated for the even and odd fields. For example, for every even field, the amount of adjustment made to the read line counter at the even field read line counter adjustment point is stored into the even field register. If the same adjustment value is stored into the even field register (i.e. the same adjustment is made) over a predetermined number of consecutive even fields, this is an indication that the length of the odd fields is off by the adjustment value. Thereafter, an adjustment of that value is made to the odd field read line counter adjustment point.

For example, if a VCR's pause mode causes every odd field to be four lines short of nominal length, then at the read line counter adjustment point 134 of every even field, a difference of four lines will be detected between $WV_{active}$ and $RV_{active}$. The detected difference of four lines is stored into the even field register. If this same value of four lines is stored into the even field register for three consecutive fields, for example, then the odd field read line counter adjustment point is advanced by four lines and the preset read line count is forced into the read line counter at that time. By moving up the odd field read line counter adjustment point, the write and read timing will be resynchronized at the beginning of the next even field.

Therefore, embodiments of the present invention provide a video signal processing system and process for tracking the read timing of a video encoder to a video decoder's data stream that minimizes buffer size and avoids dropping and/or repeating frames. Embodiments of the present invention also provide a reference subcarrier that is "mathematically linked" to the $H_{syncs}$ to optimize the performance of comb-filtered Y/C separation in a video display device. In addition, the read timing is tracked with only small adjustments to the clock frequency of the video encoder, which minimizes subcarrier jitter and frequency variations that generate objectionable hue errors in the video display device. Embodiments of the present invention can also synchronize to a newly changed source (e.g. a channel change) quickly enough that the total source change to video display device synchronization time is not onerous to the user.

What is claimed is:

1. A method for adjusting read timing associated with reading data from sequential memory with a read clock and write timing associated with writing data into the sequential memory with a write clock, the method comprising the steps of:

decreasing a read clock frequency if an amount of unread data stored in the sequential memory when a reading of a new line of data is initiated has decreased below an active threshold underflow value over one field of data, a line of data representing a sequence of data and a field of data representing a specified number of lines of data; and increasing the read clock frequency if the amount of unread data stored in the sequential memory when the reading of a new line of data is initiated has increased above an active threshold overflow value over the field of data.

2. A method as recited in claim 1, further including the steps of:

determining a fullness value for every line in the field of data, the fullness value representing how much unread data in the line was stored in the sequential memory when a reading of data in the line is initiated from the sequential memory;

storing a minimum and maximum fullness value for the field after determining the fullness value for every line in the field;

establishing at least one threshold underflow bumper and at least one threshold overflow bumper, each threshold underflow and overflow bumper representing a different fullness value for the sequential memory and a different read clock adjustment value;

designating one of the threshold underflow bumpers as the active threshold underflow value and one of the threshold overflow bumpers as the active threshold overflow value;

decreasing the read clock frequency in accordance with the read clock adjustment value of the active threshold underflow value if the fullness value of the active threshold underflow value is greater than the minimum fullness value for the field; and increasing the read clock frequency in accordance with the read clock adjustment value of the active threshold overflow value if the fullness value of the active threshold overflow value is less than the maximum fullness value for the field.

3. A method as recited in claim 2, further including the steps of:

assigning lowest to highest threshold underflow bumper designations to the at least one threshold underflow bumpers and assigning a fullness value to each threshold underflow bumper that decreases from the lowest to the highest threshold underflow bumper; and assigning lowest to highest threshold overflow bumper designations to the at least one threshold overflow bumpers and assigning a fullness value to each threshold overflow bumper that increases from the lowest to the highest threshold overflow bumper;

wherein the fullness value in the lowest threshold underflow bumper is higher than the fullness value in the lowest threshold overflow bumper.

4. A method as recited in claims 3, further including the steps of:

assigning an amount of read clock frequency increase to the read clock adjustment value in each threshold underflow bumper that increases from the lowest to the highest threshold underflow bumper; and assigning an amount of read clock frequency decrease to the read clock adjustment value in each threshold overflow bumper increases from the lowest to the highest threshold overflow bumper.

5. A method as recited in claim 4, further including the steps of:

initially designating the lowest threshold underflow bumper as the active threshold underflow value and initially designating the lowest threshold overflow bumper as the active threshold overflow value;

designating a next higher threshold underflow bumper as the active threshold underflow value if the read clock frequency is increased in accordance with the read clock adjustment value of the active threshold underflow value; and designating a next higher threshold overflow bumper as the active threshold overflow value if the read clock frequency is decreased in accordance with the read clock adjustment value of the active threshold overflow value.

6. A method as recited in claim 5, further including the steps of:

assigning the read clock adjustment value for any threshold underflow bumper such that the read clock adjustment value is no greater than the sum of the read clock adjustment values for all lower designated threshold underflow bumpers; and assigning the read clock adjustment value for any threshold overflow bumper such that the read clock adjustment value is no greater than the sum of the read clock adjustment values for all lower designated threshold overflow bumpers.

7. A method for adjusting read timing associated with reading data from sequential memory with a read clock and write timing associated with writing data into the sequential memory with a write clock, the method comprising:

increasing a read clock frequency if an accumulated frequency drift value is greater than a positive drift threshold;

decreasing the read clock frequency if the accumulated frequency drift value is less than a negative drift threshold;

storing the positive drift threshold and the negative drift threshold;

determining a fullness value for a first line in consecutive fields, a line representing a sequence of data and a field representing a specified number of lines, the fullness value representing how much unread data in the first line was stored in the sequential memory when a reading of data in the first line is initiated from the sequential memory;

computing a difference between the fullness values of consecutive fields to determine a drift value;

accumulating the drift value over consecutive fields to compute the accumulated frequency drift value;

increasing the read clock frequency according to a computed positive frequency adjustment value if the accumulated frequency drift value exceeds the positive drift threshold within a given number of consecutive fields; and decreasing the read clock frequency according to a computed negative frequency adjustment value if the accumulated frequency drift value falls below the negative drift threshold within a given number of consecutive fields.

8. A method as recited in claim 7, further including the steps of:

storing a gain factor;

computing a new drift value for the next field if the accumulated frequency drift value exceeds the positive drift threshold within a given number of consecutive fields, multiplying the new drift value by the gain factor to form the positive frequency adjustment value if the new drift value is also positive, and increasing the read clock frequency according to the positive frequency adjustment value; and computing a new drift value for the next field if the accumulated frequency drift value exceeds the negative drift threshold within a given number of consecutive fields, multiplying the new drift value by the gain factor to form the negative frequency adjustment value if the new drift value is also negative, and decreasing the read clock frequency according to the negative frequency adjustment value.

9. A method for adjusting read timing associated with reading data from sequential memory with a read clock and write timing associated with writing data into the sequential memory with a write clock, the method comprising the steps of:

storing a gain factor;

determining a fullness value for a first line in consecutive fields, a line representing a sequence of data and a field representing a specified number of lines, the fullness value representing how much unread data in the first line was stored in the sequential memory when a reading of data in the first line is initiated from the sequential memory;

computing a difference between the fullness values of consecutive fields to determine a drift value;

accumulating the drift value over consecutive fields to compute the accumulated frequency drift value;

increasing a read clock frequency according to a schedule of positive frequency adjustments computed from the accumulated frequency drift and the gain factor if an overflow condition occurs in the sequential memory; and decreasing the read clock frequency according to a schedule of negative frequency adjustments computed from the accumulated frequency drift and the gain factor if an underflow condition occurs in the sequential memory.

10. A method according to claim 9, further including the steps of:

triggering the underflow condition if an amount of unread data stored in the sequential memory when a reading of a new line of data is initiated has decreased below a first threshold, each line representing a sequence of data; and triggering the overflow condition if the amount of unread data stored in the sequential memory when the reading of a new line of data is initiated has increased above a second threshold.

11. A method as recited in claim 10, wherein if an underflow or overflow condition occurs, the method further includes the steps of:

determining a fullness value for a first line in a given number of consecutive fields of data, a field of data representing a specified number of lines of data, the fullness value representing how much unread data in the first line was stored in the sequential memory when a reading of data in the first line is initiated from the sequential memory;

computing a difference between the fullness values of the given number of consecutive fields to determine a sequence of drift values; and for each drift value in the sequence, if a polarity of a current drift value is identical to the polarity of an immediately preceding drift value, multiplying the drift value by the gain factor to form a frequency adjustment value and adjusting the read clock frequency according to the frequency adjustment value.

12. A method as recited in claim 11, further including the step of terminating the method if the polarity of the current drift value is different from the polarity of the immediately preceding drift value.

13. A system for adjusting read timing associated with reading data from sequential memory with a read clock and write timing associated with writing data into the sequential memory with a write clock, the system comprising:

a buffer for storing and retrieving data;

a first device in communication with the buffer for writing data into the buffer with the write clock;

a second device in communication with the buffer for reading the data from the buffer with the read clock, for decreasing a read clock frequency if an amount of unread data stored in the buffer when a reading of a new line of data is initiated has decreased below an active threshold underflow value over one field of data, a line of data representing a sequence of data and a field of data representing a specified number of lines of data, and for increasing the read clock frequency if the amount of unread data stored in the buffer when a reading of a new line of data is initiated has increased above an active threshold overflow value over one field of data.

14. A system as recited in claim 13, the second device further including:

logic for determining a fullness value for every line in the field of data, the fullness value representing how much unread data in the line was stored in the sequential memory when a reading of data in the line is initiated from the sequential memory; and memory for storing a minimum and maximum fullness value for the field after determining the fullness value for every line in the field;

wherein the second device establishes at least one threshold underflow bumper and at least one threshold overflow bumper, each threshold underflow and overflow bumper representing a different fullness value for the sequential memory and a different read clock adjustment value, designates one of the threshold underflow bumpers as the active threshold underflow value and one of the threshold overflow bumpers as the active threshold overflow value, decreases the read clock frequency in accordance with the read clock adjustment value of the active threshold underflow value if the fullness value of the active threshold underflow value is greater than the minimum fullness value for the field, and increases the read clock frequency in accordance with the read clock adjustment value of the active threshold overflow value if the fullness value of the active threshold overflow value is less than the maximum fullness value for the field.

15. A system for adjusting read timing associated with reading data from sequential memory with a read clock and write timing associated with writing data into the sequential memory with a write clock, the system comprising:

a buffer for storing and retrieving data;

a first device in communication with the buffer for writing data into the buffer with the write clock;

a second device in communication with the buffer for reading the data from the buffer with the read clock, for increasing the read clock frequency if an accumulated frequency drift is greater than a positive drift threshold, and for decreasing the read clock frequency if an accumulated frequency drift is less than a negative drift threshold;

memory for storing a positive drift threshold and a negative drift threshold; and logic for determining a fullness value for a first line in consecutive fields of data, a line of data representing a sequence of data and a field of data representing a specified number of lines of data, the fullness value representing how much unread data in the first line was stored in the sequential memory when a reading of data in the first line is initiated from the sequential memory;

wherein the second device computes the difference between the fullness values of consecutive fields to determine a drift value, accumulates the drift value over consecutive fields to compute an accumulated drift value, increases the read clock frequency according to a computed positive frequency adjustment value if the accumulated drift value exceeds the positive drift threshold within a given number of consecutive fields, and decreases the read clock frequency according to a computed negative frequency adjustment value if the accumulate drift value falls below the negative drift threshold within a given number of consecutive fields.

16. A system for adjusting read timing associated with reading data from sequential memory with a read clock and write timing associated with writing data into the sequential memory with a write clock, the system comprising:

a buffer for storing and retrieving data;

a first device in communication with the buffer for writing data into the buffer with the write clock; and a second device for storing a gain factor, for decreasing a read clock frequency according to a schedule of negative frequency adjustments computed from the gain factor if an underflow condition occurs in the buffer, and for increasing a read clock frequency according to a schedule of positive frequency adjustments computed from the gain factor if an overflow condition occurs in the buffer.

17. A system as recited in claim 16, the second device further including:

logic for determining a fullness value for a first line in a given number of consecutive fields of data if an underflow or overflow condition occurs, a line of data representing a sequence of data and a field of data representing a specified number of lines of data, the fullness value representing how much unread data in the first line of data was stored in the sequential memory when a reading of data in the first line is initiated from the sequential memory, and for computing the difference between the fullness values of the given number of consecutive fields to determine a sequence of drift values;

wherein, for each drift value in the sequence, if a polarity of a current drift value is identical to the polarity of an immediately preceding drift value, the second device multiplies the drift value by the gain factor to form a frequency adjustment value and adjusts the read clock frequency according to the frequency adjustment value.

* * * * *